United States Patent [19]

Nakagome et al.

[11] 3,971,981

[45] July 27, 1976

[54] MAGNETISM DETECTING SYSTEM

[75] Inventors: Yukio Nakagome, Yokohama; Teruji Watanabe, Niza; Takasuke Fukui, Tokyo; Shizuo Suzuki, Kawasaki, all of Japan

[73] Assignee: Kokusai Denshin Denwa Kabushiki Kaisha, Japan

[22] Filed: Sept. 26, 1974

[21] Appl. No.: 509,445

[30] Foreign Application Priority Data

Oct. 1, 1973  Japan.............................. 48-109320
Nov. 2, 1973  Japan.............................. 48-123875

[52] U.S. Cl................................ 324/43 R; 33/361
[51] Int. Cl.² ................: G01R 33/02; G01C 17/28
[58] Field of Search.................. 324/34 R, 43 R, 14; 33/361

[56] References Cited
UNITED STATES PATENTS 3,835,375  9/1974  Rovner............................. 324/43 R
3,854,086  12/1974  Watanabe et al................. 324/43 R

*Primary Examiner*—R. V. Rolinec
*Assistant Examiner*—Ernest F. Karlsen
*Attorney, Agent, or Firm*—Robert E. Burns; Emmanuel J. Lobato; Bruce L. Adams

[57] ABSTRACT

A magnetism detecting system, in which reference magnetic fields sequentially scan many radial scanning lines obtained by dividing a plane to be detected at regular intervals of a desired angle with respect to an origin positioned at the common intersecting point of said scanning lines. At least one parametrically excited second harmonic oscillator detects the direction and magnitude of a magnetic field to be detected along each of the scanning lines. A display device is provided for scanning and displaying the plane with respect to the origin in synchronism with the scanning of each of the scanning lines. A detected output is applied to the display device when the magnetic field to be detected and the reference magnetic field coincides with each other in direction and in magnitude.

4 Claims, 22 Drawing Figures

MAGNETISM DETECTING SYSTEM

This invention relates to a magnetism detecting system, and more particularly to a magnetism detecting system suitable for the detection of magnetic substances in the ground and in the sea bed, etc.

A method that has heretofore been employed for searching a submarine cable includes the followings steps: to dray the sea bed directly with a search anchor which is dropped into the sea at the vicinity of an area where the cable is expected to be laid in view of the data on its position prepared when it was laid; to measure the tension of a wire rope connected to the anchor on a cable ship; to detect the presence of the cable in response to an increase in the tension of the wire caused at a time when the cable is caught by the anchor, and to draw up the cable.

With such a system, however, the increase in the tension of the wire rope is not always caused when the cable is caught by the anchor, so that it is difficult to distinguish the increase from that caused when the anchor is caught by rocks or some other other objects on the sea bed. Further, in a future submarine cable laying system, the cable is buried in the sea bed about at one meter depth, so that it is almost impossible by the conventional system to search out the cable buried in the sea bed.

An object of this invention is to provide a magnetism detecting system which is free from the above defects and enables easy detecton of buried cables or the like from the sea bed.

The principle, construction and operations of this invention will be clearly understood from the following detailed description taken in conjunction with the accompanying drawings, in which.

Figures 1A, 1B, 1C, 1D:
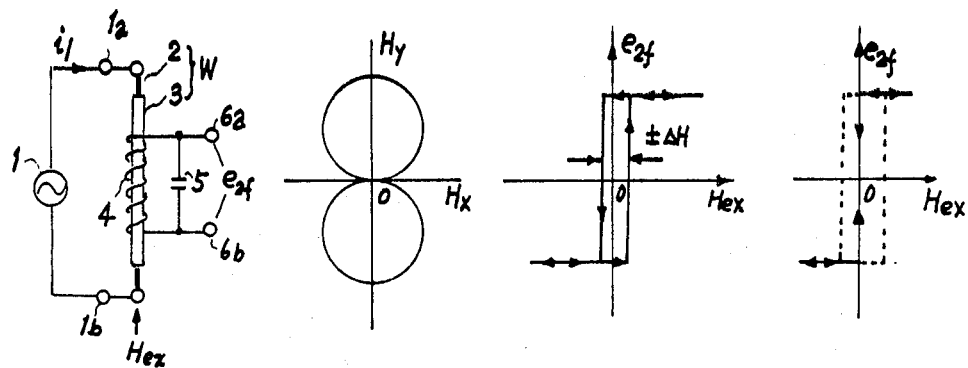
FIG. 1A is an elevation illustrating an example of a parametrically excited second harmonic oscillator emplyed in this invention.
FIGS. 1B, 1C and 1D are characteristics explanatory of the operation of the example shown in FIG. 1A.

With reference to FIGS. 1A, 1B, 1C and 1D, an example of magnetic sensor for use in this invention will first be described. In FIG. 1A, reference numeral 1 indicates an excitation current source; 2 designates a conductor wire as of copper or phosphor bronze; and 3 identifies a magnetic thin film such as a permalloy thin film electrodeposited or vapor-deposed on the surface of the conductor 2. The conductor wire 2 and the magnetic thin film 3 form a magnetic wire W. Reference numeral 4 denotes a coil wound on the above magnetic wire W; 5 represents a tuning capacitor; $1a - 1b$ show parameter-excitation terminals; and $6a - 6b$ refer to output voltage terminals.

Figure 4:
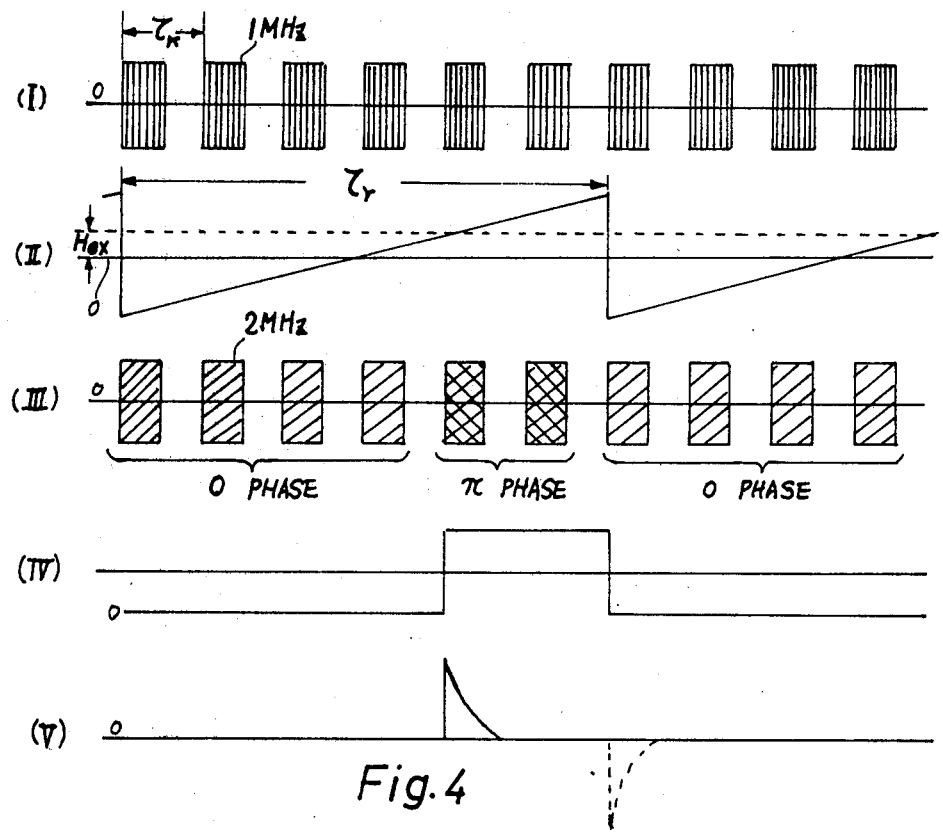

Assuming that a high-frequency exciting current of a frequency $f$ 100 percent modulated by such a rectangular wave as shown in FIG. 4($i$) is applied to the conductor 2 of the magnetic wire W, that its amplitude exceeds a certain threshold value and that the resonance frequency determined by the coil 4 and the tuning capacitor 5 is set to be $2f$, a high-frequency coltage of $2f$ is obtained across the terminals $6a$ and $6b$. It is known that, in this parametrically excited second harmonic oscillator, if the magnetic thin film 3 is sufficiently excited to produce a nonlinear inductance of the even-number order and if Q of the tuning circuit composed of the inductance 4 including the magnetic thin film and the capacitance 5 is sufficiently large, an output of the second harmonic oscillator is abruptly produced. Even where the relationship between the excitation amplitude and Q does not satisfy the condition for oscillation, a second harmonic output voltage is produced across the terminals $6a$ and $6b$, and the amplitude of the output voltage, in this case, is proportional to the magnitude of the external magnetic field Hex. Further, it is known that the phase of the output voltage assumes one of two possible phase positions differing by 180° from each other in accordance with the polarity of the external magnetic field. In this case, if the coil 4 and capacitance 5 provide a resonance frequency close to the second harmonic frequency, a second harmonic current flowing in the resonance circuit nonlinearly couples with the exciting current, so that the second harmonic voltage produced across the terminals $6a$ and $6b$ by positive feedback has an amplitude larger than that in the case where the capacitance 5 is not provided. If the relationships of the excitation to Q and the detuning degree satisfy the condition for oscillation, a second harmonic oscillation voltage can be obtained across the output terminals. The oscillation phase in this case is dependent upon the polarity of the external magnetic field impressed in the axial direction of the conductor wire 2 and assumes "0" or "$\pi$", as is the case with the above.

FIG. 1B shows the directivity pattern of the magnetic sensor with respect to a DC magnetic field in a case where the axial direction of the magnetic sensor shown in FIG. (A) and the direction perpendicular thereto are represented by the ordinate (H$y$) and the abscissa (H$x$), respectively. The illustrated directivity pattern is similar in configuration to that of a doublet antenna. FIG. (C) shows the relationship between the external magnetic field Hex and the oscillation voltage $e_{2f}$ in the parametrically excited second harmonic oscillator shown FIG. (A). This shows one example of the case where hysteresis appears in the phase characteristic of the oscillation voltage in response to a change in the polarity of the external magnetic field, and a hysteresis is dependent mainly on the $\phi$-H hysteresis characteristic of the thin film in the direction of its hard axis of magnetization and, in the case of a magnetic wire coated with a magnetic thin film having ideal uniaxial anisotropy, the hysteresis in the hard axis of magnetization does not exist but a mere nonlinear $\phi$-H characteristic exists. In such a case, if the second harmonic oscillation is caused by applying thereto an intermittent high-frequency current as an excitation current, the relationship between $e_{2f}$ and Hex becomes such as indicated by the solid line in FIG. (D) and no hysteresis exists.

However, even in case of the magnetic wire of ideal uniaxial anisotropy, if only the external magnetic filed Hex is changed under a continuously exciting condition, a hysteresis characteristic such as indicated by the broken line in FIG. (D) which is based mainly on the nonlinear inductance is resulted.

It is self-evident that if the hysteresis width exists, it becomes a condition which determines the minimum detectable sensitivity as mentioned above. It has been found by our tests that the minimum sensitivity is $1 \times 10^{-5}$ gausses in case of intermittent excitation and $4 \times 10^{-5}$ gausses in case of continuous excitation.

Figure 2:
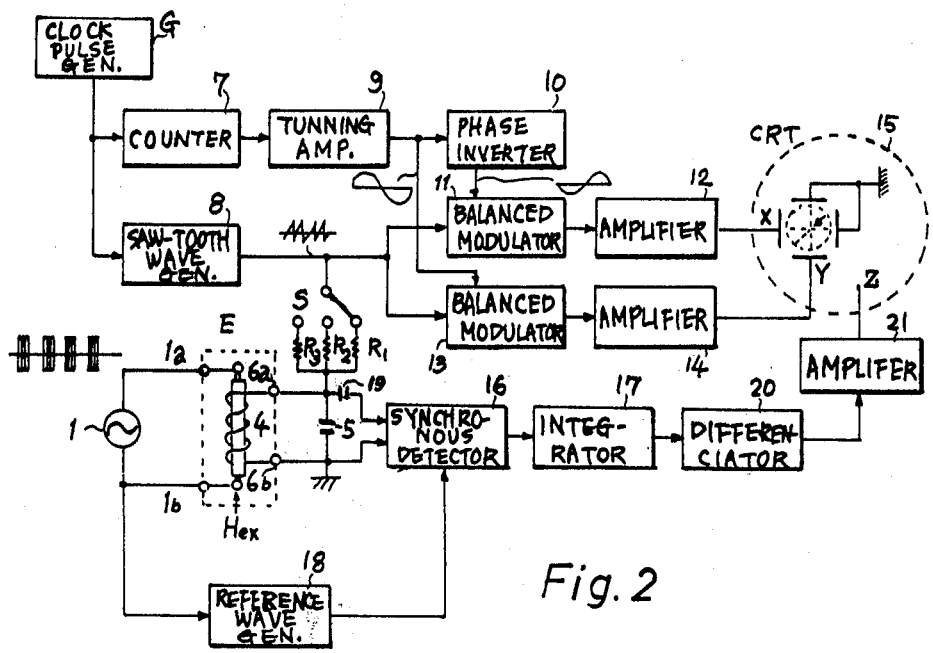
FIG. 2 is a circuit diagram illustrating an example of this invention.

FIG. 2 illustrates one example of this invention, which employs a parametrically excited second harmonic oscillator as described above and is applied, for example, to the search of a submarine cable. In the magnetic sensor, the broken line block E is assumed to continuously be rotated in the plane of the sheet. Reference numerals $1a - 1b$ and $6a - 6b$ indicate rotary contact terminals for applying an excitation current and taking out an output voltage, respectively. In a case where an excitation current, which is obtained by 100 percent modulation of a high frequency of 1MHz with a rectangular wave of 10KHz as shown in FIG. 4(i), is applied from an exciter Ex to the block E though the terminals $1a - 1b$, a parametrically excited second harmonic oscillation is caused when the amplitude of the excitation current exceeds a certain threshold value. Pulses from a clock pulse generator G are applied to a counter 7 and a saw-tooth wave generator 8. Let it be assumed that the clock pulse generator G produces $n$'s pulse at every rotation of the block E in synchronism therewith. Assuming that the the counter 7 is a scale-of-$m$ counter, it produces one output pulse each time when it is supplied with $m$'s pulses, and the output pulses are selectively amplified by a tuning amplifier 9 tuned with the repetetion frequency of the output pulse so that the amplifier output is applied to a balanced modulator 13 and to a balanced modulator 11 through a phase inverter 10. The saw-tooth wave generator 8 is synchronized with the clock pulses and produces a saw-tooth wave whose period is N-times the period of the clock pulses. The saw-tooth wave is applied to the balanced modulators 11 and 13 at the same time, from which the outputs obtained by balanced modulation of the saw-tooth wave as a carrier by a low-frequency signal wave applied from the tuning amplifier 9 are applied to the X and Y axes of a cathode-ray tube 15 through amplifiers 12 and 14, respectively.

FIGS. 3A, 3B, 3C and 3D show a sine wave generated by the tuning amplifier 9, the output of the saw-tooth wave generator 8, the output of the balanced modulator 11 and the output of the balanced modulator 13, respectively.

Figure 3A:
FIGS. 3A, 3B, 3C, 3D and 4 are waveform diagrams explanatory of the operation of the example shown in FIG. 2.
Figure 3B:
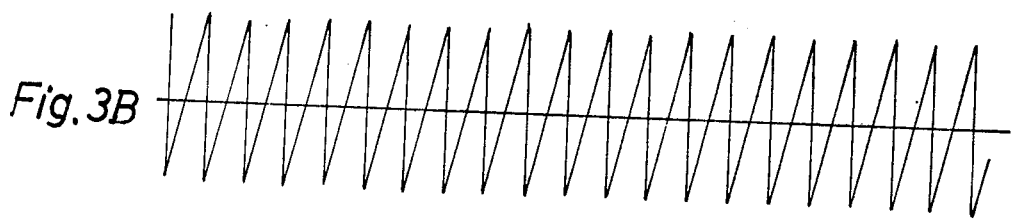

To the coil of the parametrically excited second harmonic oscillator E in FIG. 2 is applied such a saw-tooth wave current as shown in FIG. 3B from the saw-tooth wave generator 8 through a switch S, producing in the coil a magnetic field superimposed on the external magnetic field Hex. Reference numeral 19 designates a capacitor for blocking the saw-tooth wave. At this time, when the composite magnetic field of the external magnetic field and the saw-tooth wave magnetic passes zero level, the phase of the second harmonic oscillation changes from 0 to $\pi$, so that, in order to bright the position on the phosphor screen of the cathode ray tube 15 corresponding to the amplitude of the applied saw-tooth wave current at the above transition, a second harmonic voltage generated from a reference second harmonic wave generator 18, which is obtained by doubling the exciting wave, is applied to a synchronous detector 16 together with the output of the oscillator E, whereby the second output voltage derived from the oscillator E is subjected to synchronous detection by the synchronous detector 16. The detected output is applied to an integrating circuit 17 to remove its second harmonic component and its rectangular wave component. In a differentiator 20 which has a time constant different from that of the integrating circuit 17 and picks up only positive differentiated pulses, the transition from negative to positive is detected, and the differentiated voltage is impressed to a brightness modulation terminal of the cathode ray tube 15.

FIG. 4 is time charts explanatory of the above operations. In FIG. 4, a wave (i) shows one example of the exciting current waveform and a wave (ii) shows a saw-tooth wave for generating a reference magnetic field, which is applied from the saw-tooth wave generator 8 to the coil 4. Assume that the repetition period $\tau_r$ of the exciting wave is an integral multiple of the repetition period $\tau_k$ of the sawtooth wave. A wave (iii) shows the time relation of the second harmonic oscillation voltage produced across the resonance capacitance 5 and this indicates that when the reference saw-tooth wave magnetic field becomes large with respect to the external magnetic field Hex in the coil 4, the phase of the second harmonic oscillation is reversed from 0 to $\pi$. A wave (iv) shows the output waveform that the oscillation voltage is detected by the synchronous detector 16 and integrated by the integrator 17. A wave (v) shows the output waveform of the differentiator 20 which picks up the differentiated waveform of the integrated waveform charging from negative to positive. The differentiated pulse of broken line at the transition from positive to negative is removed. The positive pulse is applied to a terminal Z of the cathode ray tube 15, described later, thereby effecting the brightness modulation.

Figure 5:
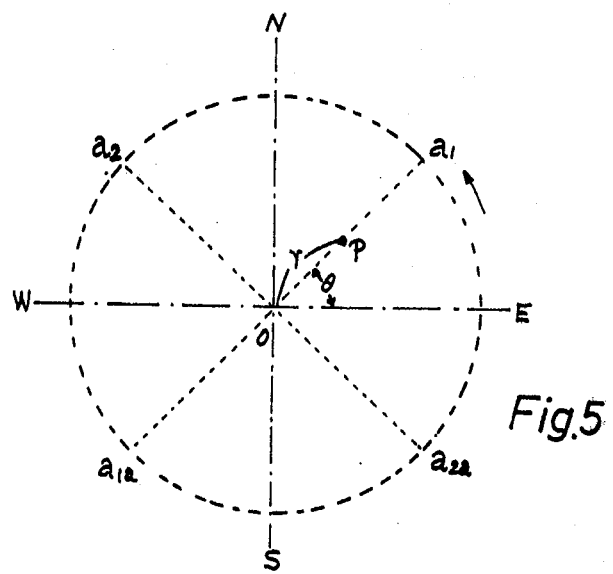
FIG. 5 is a diagram illustrating an example of a diaplayed pattern in the system of this invention.

FIG. 5 illustrates an example of a display on the phosphor screen of the cathode ray tube 15. When the phosphor screen is scanned in a direction of $a_{1a}-a_1$, a line $a_{1a}-a_1$ represents the distance from the origin $o$ in proportion to the amplitude of the saw-tooth wave applied to the coil of the oscillator E in FIG. 2. The illustrated example shows the case in which when a reference saw-tooth wave linearly increasing from the negative direction is used and the second harmonic oscillation changes from the phase 0 to $\pi$ at a point P, it is brightness-modulated through the differentiation circuit 20 and the amplifier 21 to bright only the point P. The angle $\theta$ indicates a rotation angle of the oscillator E and the distance $r$ represents a quantity proportional to the intensity of the external magnetic field.

Let it be assumed that when the external magnetic field is only in the direction $\overline{a_{1a}a_1}$, the oscillator E rotates to lie in a direction $\overline{a_{2a}a_2}$. If this direction is displaced $\pi/2$ apart from the direction $\overline{a_{1a}a_1}$, since the intensity of magnetism to the oscillator in this direction is zero, phase reversal is caused at the origin in FIG. 5, so that the origin O is brightened.

Generally, if the external magnetic field intensity is zero in all directions, it is immediately understood that only the origin O is brightened.

In a case where the intensity of the external magnetic field is higher than that of the magnetic field produced by the saw-tooth wave, the composite magnetic field does not pass the zero within the range of the amplitude of the saw-tooth wave. Consequently, no phase reverval occurs, so that, in this case, the resistance value is changed by the switch S to alter the amplitude of the applied saw-tooth current, whereby the range is adjusted in such a manner that the composite magnetic field may pass the zero.

Figure 6:
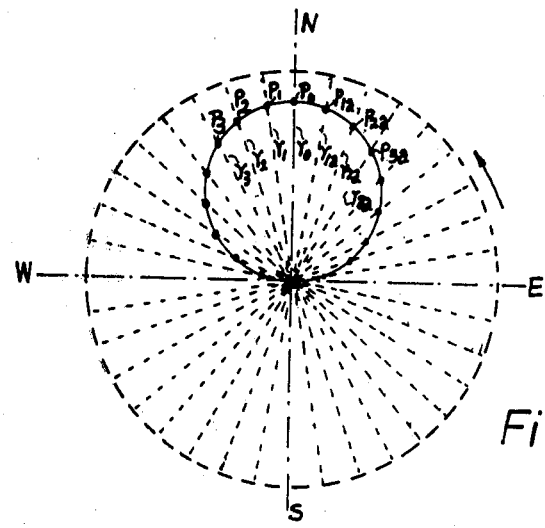
FIG. 6 is a diagram illustrating an example of a displayed pattern in the system of this invention in case of measuring the earth magnetism.

FIG. 6 illustrates one example of the results of measurement of magnetism intensity by the system of this invention in a case where only the earth magnetic field exists. This is a display on a cathode-ray tube in the case of equally dividing one rotation into 36 parts and the magnetism intensity is maximum in the direction of the north pole. In general, the direction of the maximum magnetism intensity is recognized as a direction in which the magnetic pole exists.

By the way, the search for a submarine cable or a magnetic metal on the earth is achieved in the presence of the earth magnetic field, and accordingly it is preferred to search the object in such a condition that such a constant magnetic field is cancelled.

Figure 7:
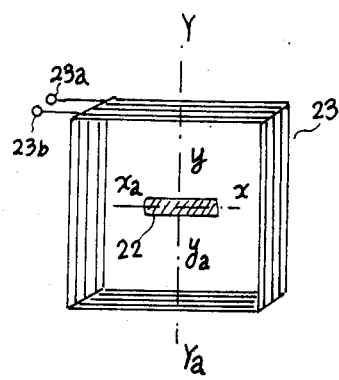
FIG. 7 is a perspective view illustrating an example of the relative arrangement of the magnetic sensor to a cancelling coil employed in this invention.

FIG. 7 illustrates an example of a magnetic sensor having a cancelling coil employed in a concrete example of this invention. Reference numeral 23 indicates a coil for cancelling the earth magnetic field; 23a and 23b designate its terminals; and 22 represents a magnetism detection sensor. The both are fixed to the same axes Y—Ya and y—$y_a$. However, the axes Y—Ya and y—$y_a$ are adapted to be rotated by independent drive systems, respectively.

Figure 8:
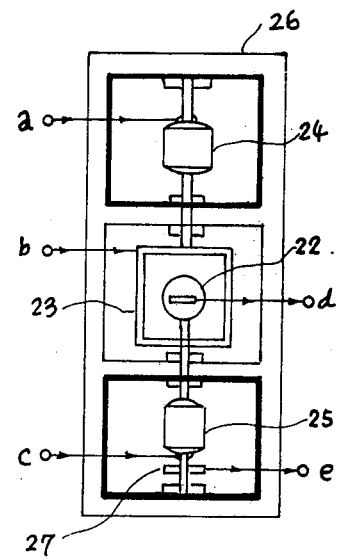
FIG. 8 is an elevation illustrating an example of holding a magnetic sensor, a cancelling coil and their drive means.

FIG. 8 shows one example of the drive system, which comprises a motor 24 for unsteady driving of the cancelling coil supported by a non-magnetic frame 26 and a motor 25 for steady driving of the magnetic sensor 22, and in which a rotation synchronizing signal generator 27 is mounted on the shaft of the motor 25 to derive from its output terminal $e$ pulses that 360° is divided equally into $n$. This generator 27 is used as the clock pulse generator G in FIG. 2. The magnetic sensor 22 is the oscillator E in FIG. 2. As is seen from the foregoing description, in a case where such a magnetic field distribution pattern as depicted in FIG. 6 is provided on the cathode-ray tube and regarded to indicate the presence of the earth magnetic field, the magnetic field intensity distribution pattern shown in FIG. 6 is adjusted, under monitoring by the cathode-ray tube, so that $P_i$ and $P_{ia}$ ($i = 1, 2, 3, \ldots$) are converged to the origin under impressing a cancelling current from a terminal $b$ while rotating the motor 24 by a desired angle by applying a driving current from a terminal $a$. At this time, if the arranged direction of the cancelling coil 23 and the magnitude of the cancelling current are appropriately adjusted, the horizontal component of the earth magnetism can be completely cancelled. However, it is assumed that the device shown in FIG. 8 is held in a vertical direction. In FIG. 8, a terminal $c$ is a terminal for a motor driving current for driving the motor 25 and a terminal $d$ is a terminal for leading out the output from the sensor.

After the above correction has once been effected, the earth magnetism is cancelled on the displayed pattern of the cathode-ray tube shown in FIG. 6 and the magnetic field intensity caused only by the object and its direction are displayed. In this case, for example, if the speed of a search ship is 15 knots, if one rotation of the sensor is equally divided into 36 parts, that is, indicated at intervals of 10°, the saw-tooth wave for sweep has a frequency of 1 KHz, while the number of revolutions of the motor for driving the sensor is about 28 r.p.m. If the number of times of detection in one sweep is 20, the intermittent frequency of the excited wave of the sensor is 20 KHz while one sweep is completed in the distance 30 cm of movement of the sensor.

Figure 3C:
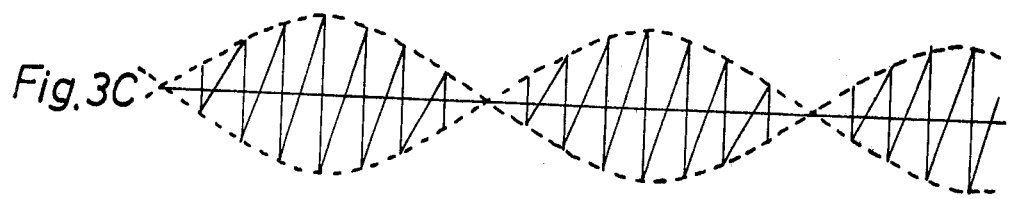
Figure 3D:
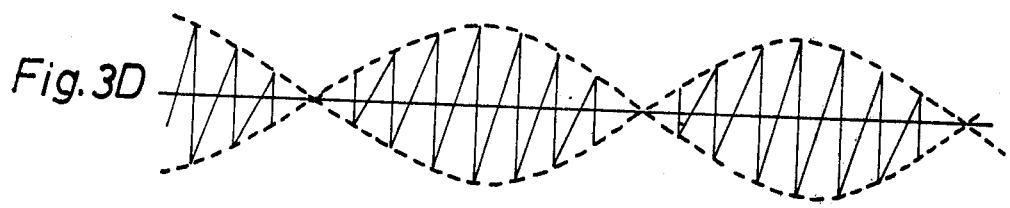
Figure 9:
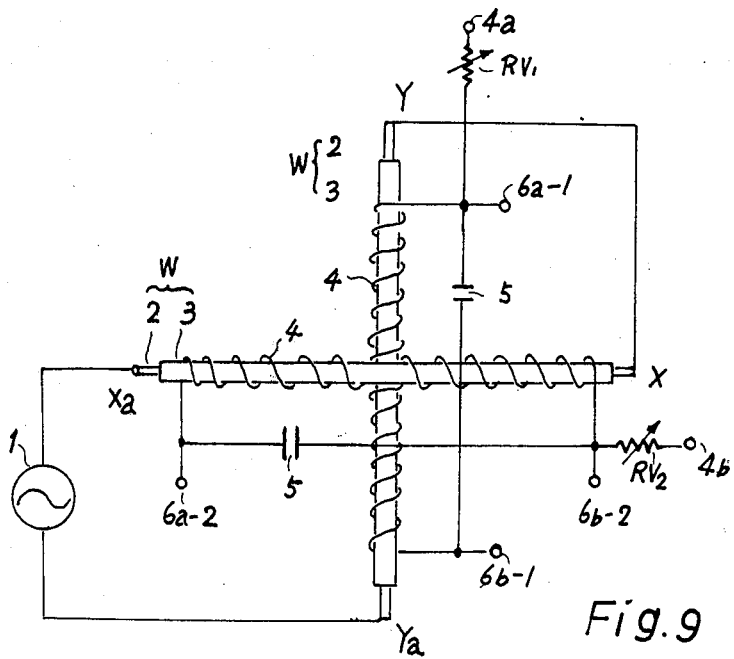
FIG. 9 is a connection diagram illustrating another example of the magnetic sensor in this invention.

The above has been described in convection with a case, in which one magnetic sensor is used and rotated in a plane, and in which the intensity and direction of an external magnetic field are displayed on a cathode-ray tube. However, such a modified form as shown in FIG. 9 can also be employed. Namely, two magnetic sensors of FIG. 1A are disposed to intersect each other at right angles and an excitation source is connected in series to them so that such reference currents as depicted in FIGS. 3C and 3D are applied to their second harmonic oscillation coils from terminals 4a and 4b, respectively. Namely, the currents shown in 3C and 3D are obtained by balanced-modulation of a saw-tooth wave of FIG. 3B with such a sine wave as shown in FIG. 3A which is displaced by $\pi/2$ apart in phase from the saw-tooth wave, so that carriers of the currents of FIGS. 3C and 3D are completely in-phase with each other. The currents of FIGS. 3C and 3D are applied to deflecting electrodes of the Y- and X-axes of the cathode-ray tube respectively.

Figure 10:
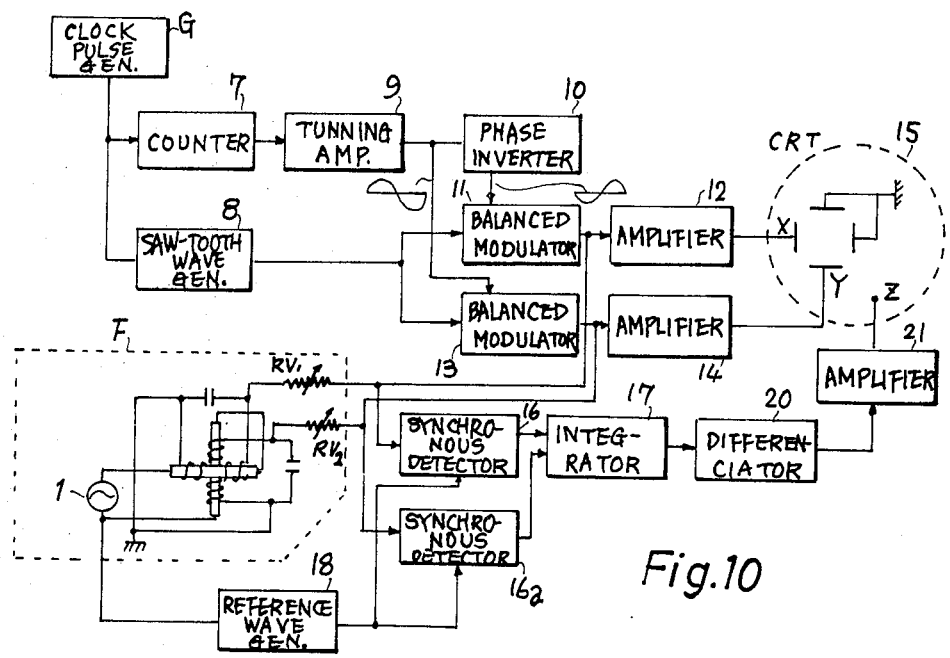
FIG. 10 is a connection diagram illustrating another example of this invention.

Under the use of such a magnetic sensor, its rotation is not required and the same results obtained by the FIG. 2 example can be also obtained. FIG. 10 shows an example of this case, which is different from the example of FIG. 2 in the following: a magnetic sensor F, the position from which the current for producing a reference magnetic field is taken out, and the provision of two synchronous detectors 16 and 16a.

When the presence of a submarine cable has been detected by the application of the system of this invention as described above, it is easy to drive a cable drawing-up device to catch and draw up the cable. In such a case, a cable catcher is dragged following after a searching head and its claws are actuated only when the catcher approaches the cable. After the cable has been caught, no change is caused in the magnetic field intensity detected by the searching head and the relation between the head and the cable does not change, so that the above spot is fixed at one point in spite of advance of the ship, by which it is recognized that the cable has been caught.

In the foregoing description, a cathode-ray tube is employed as display means but an X-Y plotter can also be used in place of the cathode-ray tube. In this case, if the voltages applied to the X- and Y-axis deflecting electrodes of the cathode-ray tube are applied to X- and Y-axis drive circuits of the X-Y plotter, respectively, and if the signal voltage applied to the Z-axis circuit of the cathode-ray tube is also applied to a pen ON-OFF circuit of the X-Y plotter, exactly the same display as in the case of the cathode-ray tube can be provided.

Figure 11:
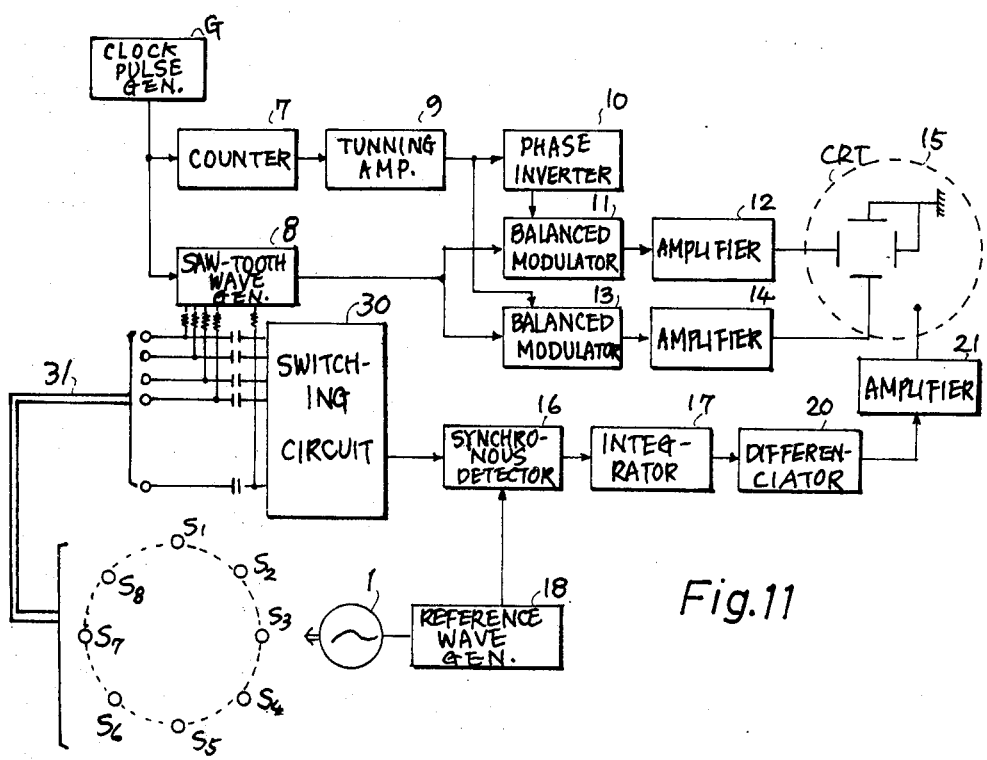
FIG. 11 is a connection diagram illustrating another embodiment of this invention.

With reference to FIG. 11, another embodiment of this invention will be described. In this embodiment, a plurality of magnetic sensors (e.g. eight sensors $S_1$, $S_2$, $S_3$, $S_4$, ... $S_8$) are disposed along a circle at desired intervals so that the main axes of their directivity patterns are substantially perpendicular to a plane including the circle. The magnetic sensors $S_1$, $S_2$, $S_3$, ... $S_8$ are driven by the excitation current applied from the excitation source 1. The outputs of the magnetic sensors $S_1$, $S_2$, $S_3$, ... $S_8$ are connected to a switching circuit 30 through connection lines $31a$, $31b$, $31c$, ... $31h$ respectively. The saw-tooth wave generated from the saw-tooth wave generator 8 is superimposed on the outputs of the sensors $S_1$, $S_2$, $S_3$, ... $S_8$ at the connection lines $31a$, $31b$, $31c$, ... $31h$. Other parts are substantially the same as those of the embodiment shown in FIG. 2.

In case of actual application, the device shown in FIG. 11 is divided into at least two parts which are connected by connection lines. In case of searching a cable laid on the sea bed, a searching unit including a plurality of magnetic sensors are towed on or in the sea while a monitoring display unit using a cathode-ray tube, etc. is provided on a cable ship. Other parts may be provided together with the searching unit or the monitoring display unit. If only the cathode-ray tube device is provided on the cable ship, at least four connection lines are employed for transmitting an X-axis signal, a Y-axis signal and a Z-axis signal and for supplying the electric power to the separated other device. If the searching unit is formed by the magnetic sensors $S_1$, $S_2$, $S_3$, ... $S_8$, the saw-tooth wave generator 8 and the switching circuit 30, at least five connection lines are necessary for transmitting the clock pulses of the clock pulse generator G, the saw-tooth wave of the saw-tooth wave generator 8, the output of the switching circuit 30, and the excitation current of the excitation source 1, and for supplying the electric power to the searching unit. However, the above division of the device can be appropriately designed to be suitable for the actual application.

Figure 12:
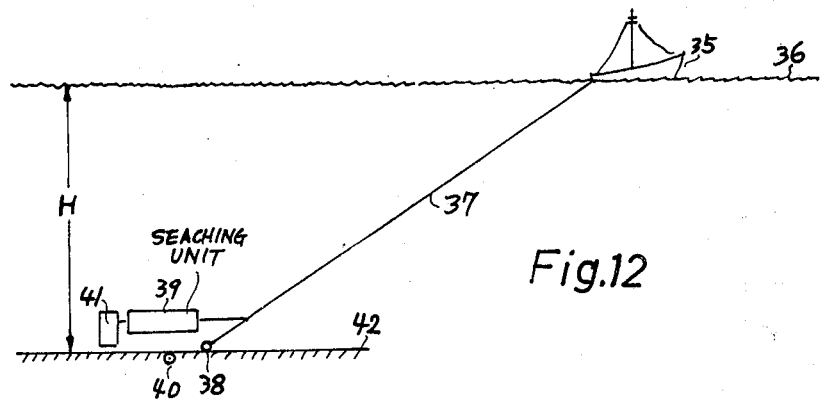
FIG. 12 is a diagram illustrating an anctual application of this invention.

FIG. 12 is an actual application of this invention showing that the searching unit and a cable excavator are towed by a cable ship. Reference numeral 35 denotes a cable ship on the sea 36; 39 identifies a searching unit including a plurality of magnetic sensors $S_1$, $S_2$, $S_3$ ... ; 38 represents a weight; 41 designates a cable excavator; 42 identifies the sea bed; 40 shows a cable buried in the sea bed 42. The weight 38, the searching unit 39 and the cable excavator 41 are dragged by a wire rope 37. The searching unit 39 and the cable excavator 41 are brought down to the sea bed 42 by the weight 38 and held at an appropriate height in parallel with the sea bed 42, that is, at a height that the magnetic sensor can detect the cable, for example, about ten meters from the sea bed 42. The connection lines described above extend along the wire rope 37.

Figures 13, 14:
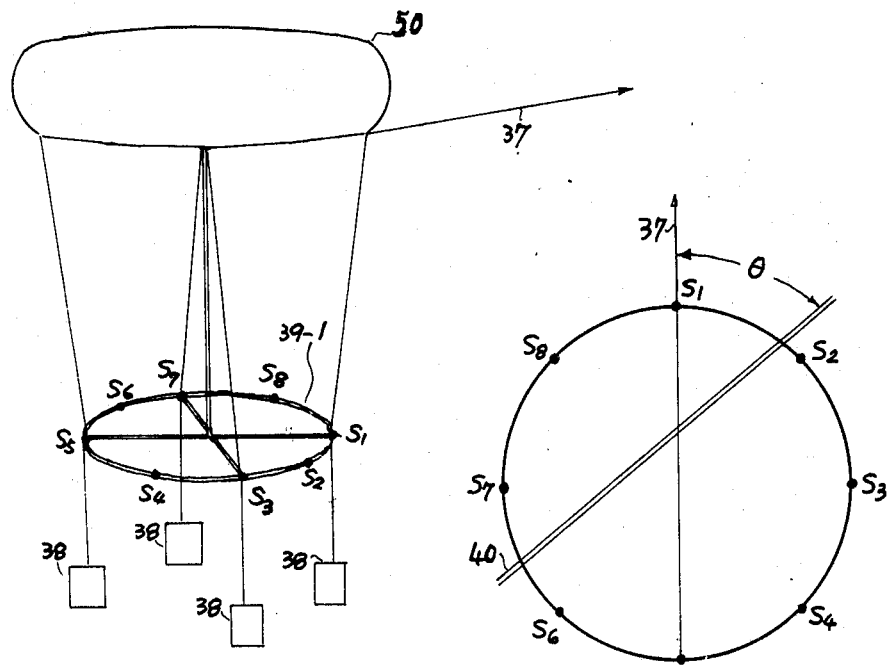
FIG. 13 is a diagram illustrating an example of arrangement of the magnetic sensors employed in this invention.
FIGS. 14, 15A and 15B are perspective view illustrating examples of a searching device employed in this invention.

FIG. 13 is a diagram showing the arrangement of magnetic sensors in the searching unit 39, in which, for example, eight magnetic sensors $S_1$ to $S_8$ are disposed on a circular ring at intervals of 45° with respect to the center of the circular ring, and exciting terminals of the respective magnetic sensors may be in series or in parallel to one another. In FIG. 13, if no magnetic flux enters in the direction of the main axis of the directivity pattern of each magnetic sensor provided on the ring-shaped searching unit 39 dragged by the wire rope 37, the output of each magnetic sensor assumes intermittent waves which are equal in number on both sides of the center level of the amplitude of the saw-tooth wave, so that the output of the synchronous detector 16 assumes positive and negative rectangular waves of equal intervals as previously described with regard to FIG. 2. If the cable 40 lies in such a direction as shown in FIG. 13, the cable 40 approaches at first the magnetic sensors $S_1$ and $S_8$ so that the magnetic flux generated from the cable 40 enters the magnetic sensors $S_1$ and $S_8$ in the direction of their axis. Accordingly, the widths of the positive and negative detected waveforms of the outputs of the magnetic sensors $S_1$ and $S_8$ are unequal to each other, by which the presence of the cable 40 can be known. As the wire rope 37 advances, the cable 40 is detected by the magnetic sensor $S_7$ too. A pattern obtained from these detected signals is displayed on a display screen provided on the cable ship 35. If detected signals are transmitted from the magnetic sensors $S_2$ and $S_6$ at a certain instant, a pattern corresponding to the magnetic sensors $S_2$ and $S_6$ on the display screen is displayed, by which the direction of the cable 40 can be detected. For example, simultaneous reversal of the oscillation phase of the magnetic sensors $S_2$ and $S_6$ in FIG. 13 indicates that the cable 40 lies in a direction deviated about 45° to right and 135° to left relative to the direction of advance of the cable ship 35. Consequently, if the length of the wire rope 37 and the depth H of the cable 40, the detected position of the cable 40 can be known. Although the examples of FIGS. 12 and 13 have been described with regard to the case where eight magnetic sensors are disposed along a circular ring at equiangular intervals, the number of the magnetic sensors is not specifically limited thereto.

Next, a concrete example of the searching unit 39 employing the magnetic sensors will be described. FIG. 14 illustrates an example of a searching unit adapted such that the circular ring of FIG. 13 including the magnetic sensors $S_1$ to $S_8$ is horizontally held in the sea. Provided above a ring 39-1 carrying the magnetic sensors $S_1$ to $S_8$ is an air bag 50 having buoyancy for suspending the ring 39-1. Further, suspended down from the ring 39-1 are weights 38 for sinking the air bag 50 and the ring 39-1 down to an appropriate depth. By balancing the weights 38 and the buoyancy of the air bag 50 with each other, the ring 9-1 carrying the magnetic sensors $S_1$ to $S_8$ can be horizontally maintained.

Figure 15A:
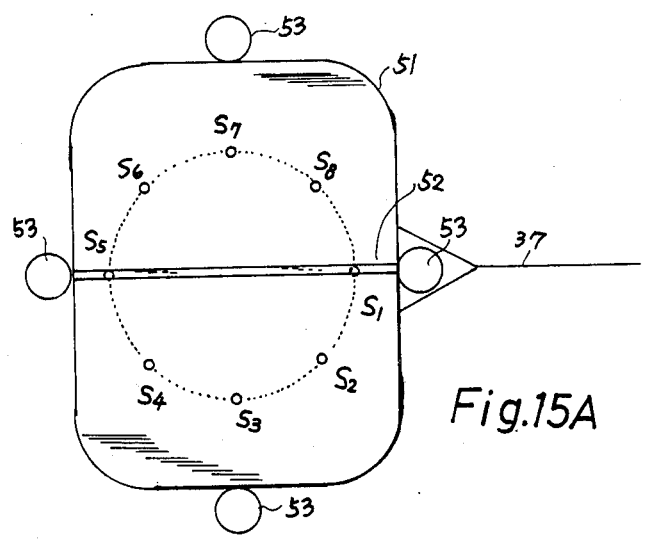
Figure 15B:
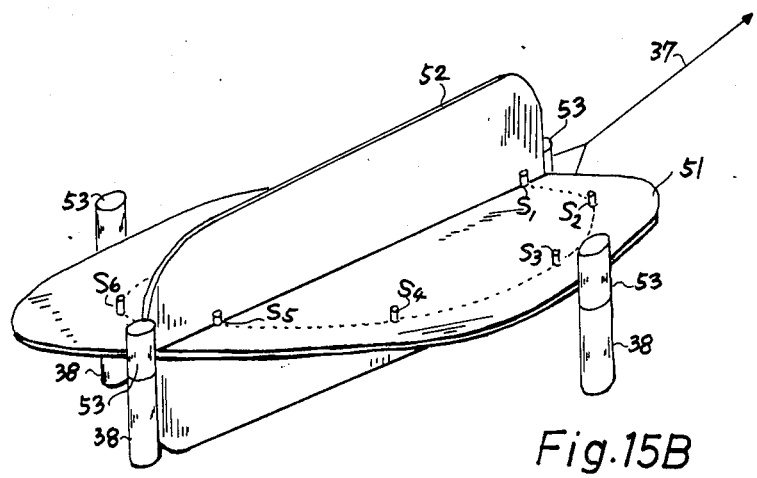

FIGS. 15A and 15B show another concrete example of the searching unite 39, in which a flat plate 51 having magnetic sensors is horizontally held in the sea. FIG. 15A is its plan view and FIG. 15B its perspective view. In this example, flat plates 51 and 52 are perpendicularly assembled together to each other and the magnetic sensors $S_1$ to $S_8$ are disposed along a dotted circle, on the flat plate 51 and fixed so that the axial line of the magnetic wire of each magnetic sensor is perpendicular to the flat plate 51. Thus, it is possible to reduce shake of the searching unit in directions perpendicular to the flat plates 51 and 52 respectively. Further, sealed air bags 53 are disposed on the periphery of the flat plate 51 carrying the magnetic sensors $S_1$ to $S_8$ in symmetrical with respect to its center and weights 38 are loaded to the air bags 53 to balance with buoyancy of the bags at an appropriate depth, by which the flat plate 51 carrying the magnetic sensors $S_1$ to $S_8$ is horizontally held with respect to the sea bed.

The foregoing examples have been described only in connection with the system for searching a cable by detecting with magnetic sensors the magnetic flux emanating from a magnetic material used in the cable. However, it is also possible to apply an weak alternating current to the cable conductor to detect by the aforesaid magnetic sensor an alternating magnetic field caused by the weak alternating current. This facilitates discrimination of the intended magnetic field from ambient magnetic disturbance, and hence enables accurate search for the cable.

As has been described in the foregoing, this invention is a system for accurately and rapidly searching the position of a cable by the output from a detector having a plurality of magnetic sensors. Accordingly there is no need of searching the cable at random and, by one scanning, the position of the cable can be detected and the direction of the cable laid can also be accurately known. By detecting the cable at more than two positions. Further, once the position of the cable has been found, it is possible to slowly pull up the excavator, so that the cable is not damaged.

Although the foregoing description has been given with regard to the case where a parametrically excited second harmonic oscillator is used as the magnetic sensor, it is also possible to employ a fluxgate-type magnetic sensor or a magnetic-modulator-type magnetic sensor.

With the system of this invention described above, by dragging along the sea bed a high-sensitivity magnetic sensor which detects the magnetic flux emanating from a submarine cable having a steel wire as a core under, if necessary, flowing therethrough a direct current or a low-frequency current, the presence and the direction of the cable and the intensity of manetism indicating the distance from the sensor to the cable can be displayed on the cathode-ray tube.

Theoretically, the system of this invention can be employed for searching mineral matters or metals in the ground or the sea bed, and hence has a variety of uses.

What we claim is:

1. A magnetism detecting system, comprising: reference magnetic field means for sequentially generating reference magnetic fields along radial scanning lines defined by dividing a plane to be scanned at regular angular intervals of a desired angle with respect to an origin positioned at the common intersecting point of said scanning lines;
    magnetic field detecting means associated with said reference magnetic field means for detecting the direction and magnitude of an unknown magnetic field to be detected along each of said scanning lines;
    display means connected to said reference magnetic field means for developing a planar display of said plane with respect to said origin in synchronism with the scanning of each of said scanning lines; and
    compare means connected to said magnetic field detecting means and said display means for applying a detected output to said display means when the unknown magnetic field to be detected and said reference magnetic field coincide with each other in direction and in magnitude to angularly display the direction and radially display the magnitude of the detected unknown magnetic field on said planar display.

2. A magnetism detecting system according to claim 1, in which said reference magnetic field means and said magnetic field detecting means comprises a parametrically excited second harmonic oscillator, means coupled to said second harmonic oscillator for mechanically rotating the directivity pattern of the second harmonic oscillator, and a saw-tooth wave generator connected to said second harmonic oscillator for superimposing a saw-tooth wave on the output of said second harmonic oscillator.

3. A magnetism detecting system according to claim 1, in which said reference magnetic field means and said magnetic field detecting means comprises two parametrically excited second harmonic oscillators having orthogonally intersecting directivity patters, a saw-tooth wave generator, a sine wave generator coupled to said saw-tooth wave generator for generating a first sine wave having a period equal to an integer multiple of that of said saw-tooth wave and a second sine wave having the same period as the first sine wave and a phase position different by 90° from the first sine wave, first balanced modulator connected to said saw-tooth wave generator, said sine wave generator and one of said two harmonic oscillators to balance-modulate the saw-tooth wave by the first sine wave so as to produce a first modulated output applied to said one of said two harmonic oscillators, and second balanced modulator connected to said saw-tooth wave generators, said sine wave generator and the other of said two harmonic oscillator to balance-modulate the saw-tooth wave by the second sine wave so as to produce a second modulated output applied to said the other of said two harmonic oscillators.

4. A magnetism detecting system according to claim 1, in which said magnetic field detecting means includes means for periodically actuating said magnetic field detecting means at a repetition frequency equal to an even number multiple of that of said saw-tooth wave.

* * * * *